United States Patent [19]

Sugaya

[11] Patent Number: 4,945,068
[45] Date of Patent: Jul. 31, 1990

[54] MANUFACTURING METHOD OF SEMICONDUCTOR NONVOLATILE MEMORY DEVICE

[75] Inventor: Tadashi Sugaya, Nara, Japan

[73] Assignee: Matsushita Electronics Corporation, Osaka, Japan

[21] Appl. No.: 426,230

[22] Filed: Oct. 25, 1989

[30] Foreign Application Priority Data

Oct. 25, 1988 [JP] Japan .................. 63-267041

[51] Int. Cl.[5] .................. H01L 27/115
[52] U.S. Cl. .................. 437/52; 437/24;
   437/43; 437/228; 437/235
[58] Field of Search .................. 437/24, 43, 52, 235,
   437/228; 357/235; 365/186

[56] References Cited

U.S. PATENT DOCUMENTS

| | | | |
|---|---|---|---|
| 4,302,766 | 11/1981 | Guterman et al. | 437/43 |
| 4,420,871 | 12/1983 | Scheibe | 437/43 |
| 4,642,881 | 2/1987 | Mal-sulcaw et el. | 437/43 |
| 4,774,197 | 9/1988 | Haddad et al. | 437/27 |
| 4,776,925 | 10/1988 | Fossum et al. | 437/34 |
| 4,822,750 | 8/1989 | Perlegos et al. | 437/43 |

OTHER PUBLICATIONS

Josquin, "The Oxidation Inhibition Nitrogen Implanted Silicon", J. Electrochem. Soc. (U.S.A.), vol. 129, No. 8, pp. 1803–1811.

Primary Examiner—Brian E. Hearn
Assistant Examiner—T. Thomas
Attorney, Agent, or Firm—Wenderoth, Lind & Ponack

[57] ABSTRACT

The invention is intended to form a thin tunnel oxide film and a thick gate oxide film simultaneously on the silicon substrate surface, by making use of the difference in the rate of oxidation between the surface of nitrogen ion injection region and the surface of injection-free region of the silicon substrate. For this purpose, nitrogen ions are injected into the area for forming the tunnel region in the silicon substrate surface, and then oxidizing the silicon substrate. Accordingly, the stress in the boundary portion between the tunnel oxide film and gate oxide film is greatly alleviated, and the number of times for rewriting data may be greatly enhanced.

4 Claims, 3 Drawing Sheets (m): Oxidation in 900°C. steam atmosphere
(n): Oxidation in 1100°C. dry oxygen atmosphere

MANUFACTURING METHOD OF SEMICONDUCTOR NONVOLATILE MEMORY DEVICE

BACKGROUND OF THE INVENTION

This invention relates to a manufacturing method of semiconductor nonvolatile memory device capable of rewriting data electrically, and more particularly to a method of forming a tunnel oxide film of a floating gate type (FLOTOX type) memory device.

Conventional nonvolatile memory devices may be roughly divided into two types. One is a device called MNOS type, in which a thin tunnel oxide film region is formed in a part of a gate oxide film, a silicon nitride film is deposited on the tunnel oxide film region, and a semiconductor film of polysilicon or the like is deposited on this silicon nitride film, and this semiconductor film is used as the gate electrode. A high voltage of about 20 V is applied to the gate electrode, and electrons are accumulated in the electron trap in the silicon nitride film, at the interface trap level between the silicon nitride film and the tunnel oxide film. The other type is a device called floating gate type (FLOTOX type), in which a thin oxide film region of about 10 nm is formed in a part of a gate oxide film, and a semiconductor film such as polysilicon completely coated with an insulating film is formed on the gate oxide film in a shape of an island. The semiconductor film that is formed like an island and is floating electrically is generally called a "floating gate." On this floating gate, an insulating film is formed, and an upper gate electrode made of polysilicon or the like is formed. A high voltage of about 20 V is applied to the upper gate electrode, and electrons are injected into the floating gate by tunneling through a thin oxide film region of about 10 nm in order to charge the floating gate electrically, thereby data is written. Therefore, generally, the thin oxide film region of about 10 nm is called a tunnel oxide film. Up to now, the floating gate type memory device is manufactured by the steps for forming a relatively thick oxide film (30 to 130 nm) as a gate oxide film, removing the gate oxide film in the region for forming the tunnel oxide film by etching, exposing the silicon substrate surface in the region for forming the tunnel oxide film by using a patterned photoresist as the mask, and forming the tunnel oxide film (2 to 12 nm) by oxidation process. FIG. 3 shows the manufacturing method of floating gate type semiconductor nonvolatile memory device by such conventional method.

First, as shown in FIG. 3 (2), a P-type silicon substrate 1 is prepared. The P-type silicon substrate 1 is of 30 to 50 ohm-cm in order to raise the memory reading speed. As shown in FIG. 3 (a), a gate oxide film 2 of 30 to 1300 nm is formed on the silicon substrate 1. Afterwards, on the surface of the gate oxide film 2, a photoresist 3 is deposited, and the photoresist 3 is patterned and only the photoresist in the region for forming the tunnel oxide film is removed.

Using the photoresist 3 as the mask, the gate oxide film 2 is partially removed generally by wet etching. Afterwards, leaving the photoresist 3, As (arsenic) or P (phosphohorus) ions are injected into the surface of the silicon substrate 1, and a region 4 of As or P ion injection is formed as shown in FIG. 3(b), which shows the sectional view after removing the photoresist 3. The gate oxide film 2 is not present on the ion injected region 4, and the surface of the silicon substrate 1 is exposed in this region 4.

Provided that the N-type ion injection for formimg the ion injected region 4 in FIG. 3 (b) may be replaced by the ion injection into an N-type impurity region 5 shown in FIG. 3 (c), depending on the shape of the floating gate 7a to be formed in a later process.

Next, in the second gate oxidation process shown in FIG. 3 (c), a tunnel oxide film 6 is formed on the surface of the ion injected region 4. Consequently, polysilicon is deposited on the entire surface of the gate oxide film 2 and the tunnel oxide film 6. Then the impurity is diffused on the polysilicon, and the polysilicon is patterned. As a result, the gate electrodes, namely the floating gate 7a, and the selection gate 7b for writing and reading data are formed.

After forming the floating gate 7a and the selection gate 7b by patterning the polysilicon, ions of P or As are injected in the silicon substrate 1 at a concentration of about $1 \times 10^{14}$ ions/cm$^2$ by using the patterned photoresist for patterning the floating gate 7a and the selection gate 7b as the mask. As a result, the N-type impurity regions 5 are formed in the silicon substrate 1 as shown in FIG. 3 (c). The N-type impurity regions 5 contribute to enhancement of the drain breakdown voltage of the selection gate 7b, and also function as the diffusion layer for drifting the electrons to the tunnel oxide film 6 immediately beneath the floating gate 7a. Therefore, the concentration of the N-type impurity regions 5 cannot be raised too much. Incidentally, as explained hereinabove, if the central N-type impurity region 5 in FIG. 3 (c) reached up to the ion injected region 4 in FIG. 3 (b) by heat diffusion, the ion injection process for forming the ion injected region 4 may be omitted. The oxide film thickness of the tunnel oxide film 6 grown in the second gate oxidation process must be in a range of 5 to 15 nm. Usually it is about 10 nm. The area of the tunnel oxide film 6 is required to be small in consideration of the characteristics of operation of the FLOTOX type nonvolatile memory. Therefore, usually it is about 1 $\mu$m square which is the minimum size of exposure apparatus at present.

In sequency, as shown in FIG. 3 (d), the surface of the floating gate 7a and selection gate 7b is oxidized, and a second gate oxide film 8 is formed. Then, growing again polysilicon on the surface of the second gate oxide film 8, the polysilicon is patterned, and a second gate called control gate 9 is formed. Furthermore, as shown in FIG. 3 (e), the gate oxide film is removed from the unnecessary portion on the surface of the silicon substrate 1, and then, ions of As, P or the like are injected in order to form highly concentrated N-type diffusion layers 10. The highly concentrated N-type diffusion layers 10 function as source, drain of MOS transistor.

Finally, as shown in FIG. 3 (f), the entire surface of the silicon substrate 1 including the control gate 9 is coated with an insulating film 11. Usually, this insulating film 11 is formed by the oxidation treatment of polysilicons 7a, 7b, 9, and oxidation treatment of the surface of the silicon substrate 1.

After FIG. 3 (f), same as in the process of ordinary semiconductor device, a thick insulating film is further deposited on the surface of the silicon oxide film 11, and contact holes are opened in the insulating film. Then the highly concentrated N-type diffusion layers 10 and the polysilicon gates 7a, 7b are connected to the metal wirings formed on the insulating film through the contact holes, so that the nonvolatile memory is completed. In almost all cases, needless to say, a final protective film is deposited on the device surface.

In the prior art, the tunnel oxide film 6 is a very thin oxide film of 5 to 15 nm, and it is difficuly to obtain a stable and uniform film thickness by the ordinary oxidation method. Accordingly, the oxygen partial pressure of the oxidation atmosphere is diluted with inert gas such as Ar (argon), He (helium) and $N_2$ (nitrogen), or the oxidation temperature is lowered to oxidize the gate, thereby forming an ultrathin tunnel oxide film 6. Besides, a film thickness of as much as 30 to 150 nm is required for the gate oxide film 2, other than the tunnel oxide film 6, beneath the floating gate 7a, and therefore in order to form such a thick gate oxide film 2 beneath the floating gate 72, two steps of oxidation, one step of photoresist patterning for defining the region of tunnel oxide film 6, and one step of etching of the first gate oxide film for using the photoresist pattern as the mask are required. Furthermore, when forming the tunnel oxide film 6, since the thick gate oxide film 2 is formed in other regions than the region for forming the tunnel oxide film 6, a stress is caused on the silicon substrate surface in the boundary portion between the tunnel oxide film 6 and the surrounding thick gate oxide film 2 at the time of growth of the tunnel oxide film 6, and therefore the oxide film quality of the tunnel oxide film 6 deteriorates. As a result, the number of times capable of rewriting data is decreased, and therefore, it is difficult to obtain a favorable data rewriting characteristics as a semiconductor nonvolatile memory device.

SUMMARY OF THE INVENTION

It is hence a first object of the invention to present a manufacturing method of semiconductor nonvolatile memory device possessing favorable data rewriting characteristics by forming an ultrathin tunnel oxide film in part of a thick gate oxide film without generating any stress at their boundary portion.

It is a second object of the invention to present a manufacturing method of semiconductor nonvolatile memory device capable of obtaining a thick oxide film and an ultrathin tunnel oxide film by a single oxidation step.

The invention is, in short, intended to inject nitrogen ions ionized from nitrogen atoms or nitrogen molecules into the area for forming the tunnel region in the silicon substrate surface, and then oxidize the silicon substrate, thereby forming a ultrathin tunnel oxide film and a thick gate oxide film simultaneously on the surface of silicon substrate.

When the nitrogen ions ionized from nitrogen atoms or nitrogen molecules are injected in the silicon substrate surface, the rate of oxidation of the substrate surface in the nitrogen ion injection region becomes slower than the rate of oxidation of the substrate surface in the region free from nitrogen ions. Accordingly, by preliminarily injecting the nitrogen ions in the forming position of tunnel region on the silicon substrate surface, and oxidizing the silicon substrate surface afterwards, by making use of the difference in the rate of oxidation of the substrate surface depending on the presence or absence of nitrogen ion injection, the ultrathin tunnel oxide film of about 10 nm on the nitrogen ion injection region, and the thick gate oxide film of about 30 to 1500 nm on the other regions can be formed simultaneously by one oxidation step.

Accordingly to this invention, since the tunnel oxide film and gate oxide film can be formed simultaneously by a single oxidation step, the manufacturing process of semiconductor nonvolatile memory device may be greatly simplified.

Still more, even at a relatively high temperature, an ultrathin tunnel oxide film of about 10 nm may be stably formed in an ordinary oxidation atmosphere. What is made, since the ultrathin tunnel oxide film and the thick oxide film are simultaneously formed integrally, the stress in the boundary portion between the two films will be greatly lessened. Therefore, a semiconductor nonvolatile memory device excellent in the data rewriting characteristics may be realized.

Other objects and effects of the invention will be better understood and appreciated from the following detailed description of the preferred embodiments taken in conjunction with the drawings.

DETAILED DESCRIPTION OF THE INVENTION

Figure 1A:
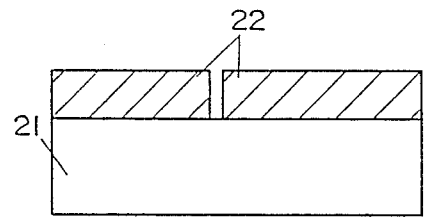
FIG. 1 (a) to (f) are sectional views showing the sequential steps of the manufacturing method of a semiconductor nonvolatile memory device in one of the embodiments of the invention.
Figure 1D:
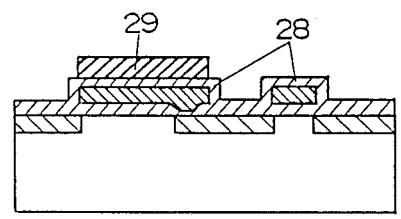
Figure 1B:
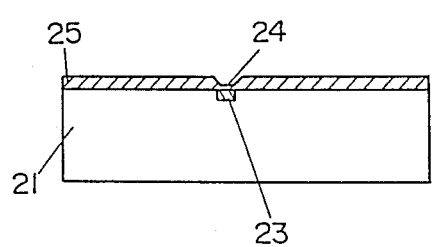
Figure 1E:
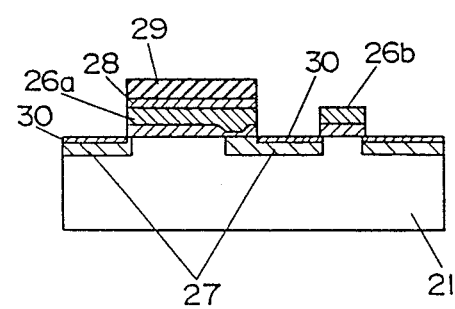
Figure 1C:
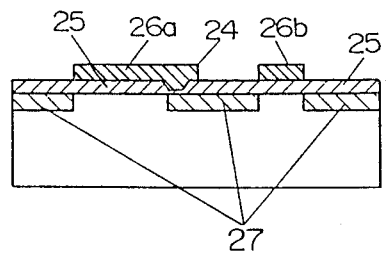
Figure 1F:
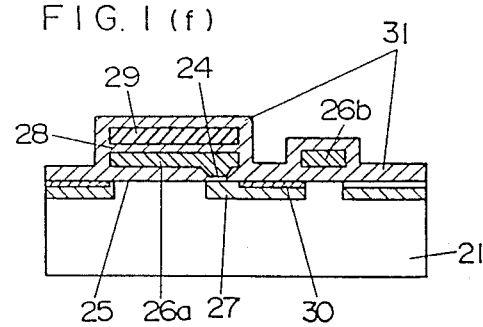

FIG. 1 shows sectional views of a memory cell in the manufacturing steps of semiconductor nonvolatile memory device in one of the embodiments of the invention.

First, as shown in FIG. 1 (a), the surface of a silicon substrate 21 is coated with a mask 22 for ion injection such as photoresist, thermal oxidation film, insulating film and semiconductor thin film, and only the mask material in the ion injecting region is removed by patterning. Next, from above the mask 22, As (arsenic) or P (phosphorus) ions are injected in the surface of the silicon substrate 21, and an N-type diffusion layer 23 of tunnel oxide film forming region is formed. In consequence, an ion beam ionized from nitrogen atoms or nitrogen molecules is omitted to the silicon substrate 21, thereby nitrogen ions are injected in the tunnel oxide film forming region.

After nitrogen ion injection, the mask 22 for ion injection is removed, and the surface of the silicon substrate 21 is exposed. Afterwards, in an appropriate oxidation condition (for example, 1100° C.), the surface of the silicon substrate 21 is oxidized, and a thin tunnel oxide film 24 of about 10 nm and a thick first gate oxide film 25 of about 30 to 1500 nm in its periphery are formed simultaneously as shown in FIG. 1 (b).

That is, the rate of oxidation of the substrate surface in the nitrogen ion injection region is slower than the rate of oxidation of the substrate surface in the other regions. Therefore, in a certain oxidation condition (1100° C., in this example), when the surface of the silicon substrate 21 is oxidized, the thin tunnel oxide film 24 is formed on the surface of the tunnel region by nitrogen ion injection (that is, N-type diffusion layer 23), while the thick first gate oxide film 25 is formed on the other surface, owing to the difference in the rate of oxidation.

In the next step, polysilicon is deposited on the entire surface of the tunnel oxide film 24 and first gate oxide film 25, and by patterning this polysilicon, a floating gate 26a and a selection gate 26b for memory cell selection are formed as shown in FIG. 1 (c). Consequently, from above the floating gate 26a and selection gate 26b, P (phosphorus) ions are injected at a concentration of $1 \times 10^{14}$ ions/cm$^2$, and N-type diffusion layers 27 of low concentration are formed in the surface region of the silicon substrate 21 as shown in FIG. 1 (c). At this time, the N-type diffusion layer 23 beneath the tunnel oxide film 24 is electrically connected with the control N-type diffusion layer 27 of low concetration injected later. In the sectional views after FIG. 1 (c), for the sake of convenience, the N-type diffusion layer 23 beneath the tunnel oxide film 24 is mentioned as an inclusive part of the control N-type diffusion layer 27 of low concentration. Next, as shown in FIG. 1 (d), the surface of the floating gate 26a and the selection gate 26b is oxidized, or a nitride film is deposited so as to coat with a second gate oxide film 28 which is an insulating film. Afterwards, a second polysilicon for memory control is grown on the second gate oxide film 28, and by patterning the second polysilicon, a control gate 29 is formed.

As shown in FIG. 1 (e), consequently, after removing the insulating films (first and second gate oxide films 25 and 28) on the surface of the silicon substrate 21, As (arsenic) or P (phosphorus) ions are injected in the surface of silicon substrate 21 at a concentration of $1 \times 10^{15}$ to $2 \times 10^{16}$ ions/cm$^2$, and an N-type diffusion layer 30 of high concentration is formed. Such N-type diffusion layers 30 of high concentration function as source and drain of MOS transistor.

Finally, as shown in FIG. 1 (f), the surface of the control gate 29, floating gate 26a and selection gate 26b is oxidized. By this oxidation treatment, the entire surface of the silicon substrate 21 is coated with silicon oxide film 31. After FIG. 1 (f), as widely known well, a thick insulating film is further deposited on the surface of the silicon oxide film 31, and contact holes are opened in the thick insulating film. Afterwards, metal wirings are formed on the surfaces of thick insulating film and in the contact holes so as to execute necessary connections. Furthermore, a final protective film is formed on the surface of the device, and then the openings for wire bondings are formed in the final protective film, thereby a semiconductor nonvolatile memory device is completed.

Figure 2:
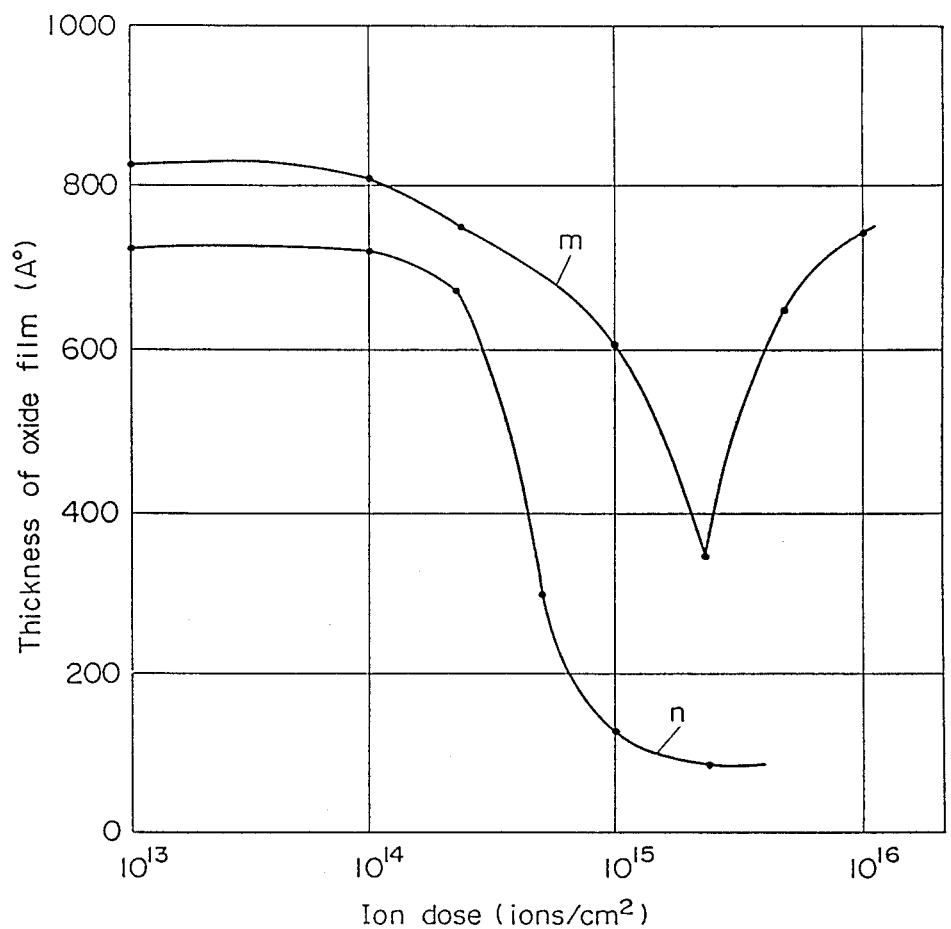
FIG. 2 is a diagram showing the relation between the ion dose and the thickness of the grown oxide film, when nitrogen molecule ions are injected in a silicon substrate at 50 kev and oxidation treatment is given for a specified time in one of the embodiments of the invention, and FIG. 3 (a) to (f) are sectional views showing the sequential steps of the conventional manufacturing method of semiconductor nonvolatile memory device.
Figure 3A:
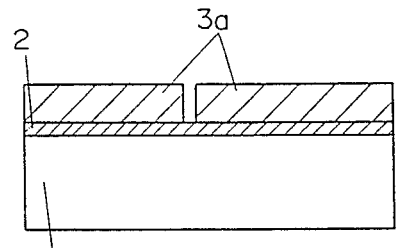
Figure 3D:
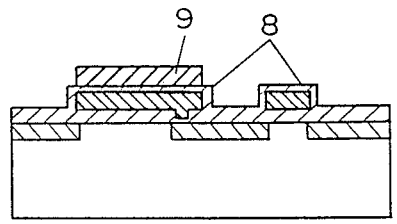
Figure 3B:
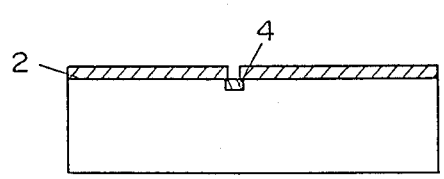
Figure 3E:
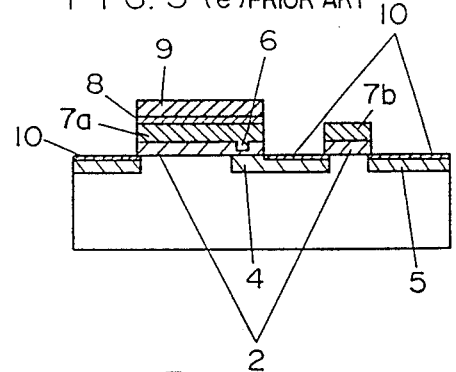
Figure 3C:
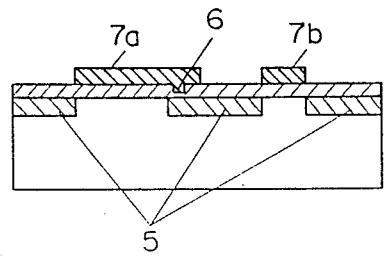
Figure 3F:
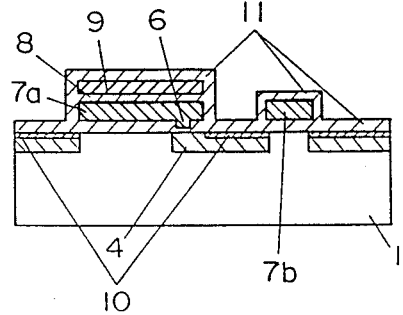

FIG. 2 shows an example of change of oxidation rate of the silicon surface by injection of nitrogen molecule ions in the silicon substrate 21 at ion acceleration energy of 50 kev. In this diagram, the curve (m) shows the thickness of the oxide film grown by oxidation for a specific time in an 900° steam atmosphere, while the curve (n) relates to the thickness of oxide film grown by oxidation for a specific time in a 1100° C. dry oxygen atmosphere.

At the acceleration energy of 50 kew, when nitrogen molecule ions (N2+) are injected into the silicon substrate 21, as shown in FIG. 2, at a dose of less than $5 \times 10^{13}$ ions/cm$^2$, the oxidation rate of silicon is hardly changed. When injected in a range of $2 \times 10^{14}$ to $1 \times 10^{15}$ ions/cm$^2$, the oxidation rate is extremely lowered. By injecting nitrogen molecule ions at an acceleration energy of 50 kev at a dose of $3 \times 10^{15}$ ions/cm$^2$ into the surface of the silicon substrate 21, and oxidizing for a specific time in 1100° C. dry oxygen atmosphere, an oxide film of 8 nm was grown on the ion injected region, while an oxide film of 73 nm was simultaneously grown on the other non-injected regions. The silicon substrate used in this embodiment is of face orientation <100<, P type, with resistivity of 20 60 30 ohm-cm. As known from curve (m) in FIG. 2, when the dose of nitrogen ions is further increased, if the oxidation atmosphere is not appropriate, the difference in the oxidation rate between the nitrogen ion injection region and the injection-free region is not so great. Accordingly, the annealing condition after nitrogen ion injection, among other oxidation conditions, must be selected with great care. When set in a proper oxidation condition, it is evident that the thin tunnel oxide film 24 of about 10 nm and the first gate oxide film 25 of a relatively great thickness or scores of nanometers in its periphery can be formed by a same oxidation process. Since the tunnel oxide film 24 and its peripheral first gate oxide film 25 can be formed by a single oxidation process, a smooth taper, instead of a step difference, is formed in the boundary of the tunnel oxide film 24 and its peripheral first gate oxide film 25. Accordingly, different from the conventional method of forming the tunnel oxide film and the peripheral gate oxide film separately, the stress at the step portion of the surrounding of the tunnel oxide film 24 may be greatly reduced. Meanwhile, nitrogen atoms are taken into the film of the tunnel oxide film 24, and the tunnel oxide film 24 becomes a film quality similar to that of oxynitride film (SixOyNz). When an oxynitride film is used as the tunnel oxide film 24, it is konwn and reported that a device high in reliability against repetition of electron tunnel phenomenon may be obtained (International Electron Device Meeting, 1828, Technical Digest Paper No. 30.9, pp. 811, 812, Dec. 1982). In this respect, too, the nonvolatile memory device of this invention possess a high reliability.

In the foregoing description, incidentally, an example of ionizing nitrogen molecules and injecting directly into the silicon substrate 21 is shown, but, needless to say, similar effects will be obtained even if a thin oxide film is preliminarily formed on the silicon substrate surface, and nitrogen ions are injected in the silicon substrate through the thin oxide film by properly selecting the acceleration energy of ion injection.

The nitrogen ions to be injected may be either N+ (nitrogen atom ions) or N2+ (nitrogen molecule ions), and similar effects may be obtained by polyvalent ions. Similar effects are, of course, expected by using molecule ions containing nitrogen atmos such as NH$_3$+.

According to the invention, after injecting nitrogen ions in the silicon substrate, the ion injection region and injection-free region are simultaneously subjected to oxidation, so that the tunnel oxide film and its peripheral first gate oxide film may be formed at the same time. Therefore, as compared with the conventional method, the oxidation steps may be saved. Incidentally, in the conventional method, when forming a tunnel oxide film, the oxidation film in the tunnel region out of the first gate oxide film was removed, and then oxidation was conducted again. As a result, the step difference between the tunnel oxide film and its peripheral first gate oxide film was steep, and a strong stress was applied in the tunnel oxide film near the boundary of the two oxide films. By contrast, in this invention, the tunnel oxide film and its peripheral first gate oxide film are formed simultaneously, and a moderate slope is formed in the boundary portion of the two films. Hence, the stress of the tunnel oxide film is notably alleviated. Furthermore, according to the invention, since the nitrogen atoms are taken into the tunnel oxide film, a favorable tunnel oxide film again 56 tunneling of electrons may be realized. As a result, a nonvolatile memory device capable of rewriting more times may be manufactured in a fewer number of oxidation steps than in the prior art.

What is claimed:

1. A manufacturing method of semiconductor nonvolatile memory device comprising:

a step of forming a mask on the surface of a silicon substrate, and patterning said mask, a step of injecting nitrogen ions into the surface of said silicon substrate from above said mask, a step of removing said mask, 'a step of forming oxide films on the surface of said silicon substrate by simultaneously oxidizing the nitrogen ion injection region and the injection-free region of said silicon substrate surface, thereby forming an ultrathin tunnel oxide film on said nitrogen ion injection region and a thick first gate oxide film on said injection-free region of said silicon substrate surface respectively, a step of depositing a first semiconductor thin film on the surface of said tunnel oxide film and said first gate oxide film, a step of forming a first gate in a shape of covering at least said nitrogen ion injection region by patterning said first semiconductor thin film, a step of forming an insulating film on the surface of said first gate, a step of depositing a second semiconductor thin film on the surface of said insulating film, and a step of forming a second gate overlapping with said first gate and said insulating film, by patterning said second semiconductor thin film.

2. A manufacturing method od semiconductor nonvolatile memory device according to claim 1, wherein said nitrogen ions are injected in a concentration range of $1 \times 10^{14}$ to $1 \times 10^{16}$ ions/cm$^2$.

3. A manufacturing method of semiconductor nonvolatile memory device according to claim 1, wherein a thin oxide film is formed on the surface of said silicon substrate, and said nitrogen ions are injected into the surface of said silicon substrate through said thin oxide film.

4. A manufacturing method of semiconductor nonvolatile memory device according to claim 1, wherein, the step of injecting nitrogen ions includes injecting at least one of 2 any molecule ions containing nitrogen atom ions, nitrogen molecule ions, nitrogen polyvalent ions and nitrogen atoms.

* * * * *